United States Patent
Ritenour

(10) Patent No.: US 6,346,446 B1
(45) Date of Patent: Feb. 12, 2002

(54) METHODS OF FORMING FEATURES OF INTEGRATED CIRCUITS USING MODIFIED BURIED LAYERS

(75) Inventor: Andrew P. Ritenour, Richmond, VA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/317,239

(22) Filed: May 24, 1999

Related U.S. Application Data

(60) Provisional application No. 60/087,782, filed on Jun. 1, 1998.

(51) Int. Cl.$^7$ .................. H01L 21/336; H01L 29/80; H01L 31/112
(52) U.S. Cl. .................. 438/283; 438/300; 257/260
(58) Field of Search .................. 438/195, 282, 438/283, 300, 157, 159; 257/260

(56) References Cited

U.S. PATENT DOCUMENTS

| | | | |
|---|---|---|---|
| 4,959,697 A | * 9/1990 | Shier et al. | 357/22 |
| 5,139,962 A | * 8/1992 | Tanaka | 437/41 |
| 5,273,921 A | 12/1993 | Neudeck et al. | 437/41 |
| 5,296,727 A | * 3/1994 | Kawai et al. | 257/260 |
| RE34,821 E | * 1/1995 | Khader et al. | 257/270 |
| 5,497,019 A | 3/1996 | Mayer et al. | 257/347 |
| 5,563,080 A | * 10/1996 | Ahn | 437/41 |
| 5,604,368 A | 2/1997 | Taur et al. | 257/348 |
| 5,646,058 A | * 7/1997 | Taur et al. | 437/40 R |

OTHER PUBLICATIONS

Perez–Rodriguez et al., "Etch–Stop Behavior of Buried Layers Formed by Substoichiometric Nitrogen Ion Implantation into Silicon," J. Electrochem. Soc., vol. 143, No. 3, Mar. 1996, pp. 1026–1033.

Frank et al., "Monte Carlo Simulation of a 30 nm Dual–Gate MOSFET: How Short can Si Go", 1992 IEEE, EIDM 92–553–556, pp. 21.1.1–21.1.4.

Antoniadis et al., "Physics and Technology of Ultra Short Channel MOSFET Devices," 1991 IEEE, IEDM91–21–24, pp. 2.1.1–2.1.4.

Wong et al., "Design and Performance Considerations for Sub–0.1μm Double–Gate SOI MOFSET's," 1994 IEEE, IDEM 94–747–750, pp. 30.6.1–30.6.4.

Wong et al., "Self–Aligned (Top and Bottom) Double–Gate MOSFET with a 25 nm Thick Silicon Channel," International Electron Devices Meeting, Washington, DC, Dec. 7–10, 1997, pp. 16.6.1–16.6.4.

Kudo et al., "Dry and wet etching properties of thermally grown silicon dioxide layer after N$^+$ ion implantation and annealing," Nuclear Instruments and Methods in Physics Research B80/81, 1993, pp. 1010–1013.

(List continued on next page.)

Primary Examiner—Olik Chaudhuri
Assistant Examiner—Shrinivas H. Rao
(74) Attorney, Agent, or Firm—Myers Bigel Sibley & Sajovec

(57) ABSTRACT

Self-aligned features of double sided integrated circuits are formed by modifying a buried layer in an integrated circuit substrate to provide a modified buried layer. The modified buried layer can be formed using ion implantation. In particular, a first feature on an upper surface of the integrated circuit is used as a mask during an ion implantation step. The first feature on the upper surface shields an underlying portion of the modified buried layer from the ion implantation, thereby preventing the modification of the underlying portion. The integrated circuit is flipped over and a lower surface of the integrated circuit is processed wherein a second feature is formed on the lower surface using the modified buried layer as a mask. Accordingly, the second feature is formed self-aligned to the modified buried layer and to the first feature.

31 Claims, 5 Drawing Sheets

OTHER PUBLICATIONS

Feijoo et al., "Etch Stop Barriers in Silicon Produced by Ion Implanation of Electrically Non–Active Species," J. Electrochem. Soc., vol. 139, No. 8, Aug. 1992, pp. 2309–2314.

Collins, "Etch Stop Techniques for Micromachining," J. Electrochem. Soc., vol. 144, No. 6, Jun. 1997, pp. 2242–2262.

S. Chou, Slide Presentation, May, 1998, 33 Slides.

Roberds et al., "Investigation of a Novel Self–Aligned Dual Gate MOSFET Structure," Proceedings 1998 IEEE International SOI Conference, Oct., 1998, pp. 109–110.

Kim et al., "Advanced Integration Technology for a Highly Scalable SOI DRAM with SOC (Silicon–On–Capacitors)," IEDM 96–605–608, pp 22.5.1–22.5.4.

Chatterjee et al., "Sub–100nm Gate Length Metal Gate NMOS Transistors Fabricated by a Replacement Gate Process," Semiconductor Process and Device Center, MS 3702 Texas Instruments, P.O. Box 650311, Dallas, TX 75265.

Park et al., "WP25.5 Performance Characteristics of SOI DRAM for Low–Power Application," 1999 IEEE International Solid–State Circuits Conference, pp. 434, 435, 521, 522.

* cited by examiner

METHODS OF FORMING FEATURES OF INTEGRATED CIRCUITS USING MODIFIED BURIED LAYERS

CROSS REFERENCE TO RELATED APPLICATION

This application claims the benefit of provisional Application Ser. No. 60/087,782, filed Jun. 1, 1998, filed in the name of the present inventor and entitled "Fabrication and Device Technology for Double-Gate Field Effect Transistors."

FIELD OF THE INVENTION

The present invention relates to the field of integrated circuits in general, and more particularly, to the fabrication of self-aligned features of integrated circuits.

BACKGROUND OF THE INVENTION

Transistors, such as Metal Oxide Semiconductor Field Effect Transistors (MOSFET devices) are commonly used to provide switching functions in integrated circuits. For example, when the MOSFET device is on, current flows in a channel between the source and the drain of the MOSFET device. Ideally, when the MOSFET device is off, no current flows in the channel. In practice, however, a small leakage current may flow in the channel when the MOSFET device is off.

To increase the performance and density of integrated circuits, the size of the MOSFET devices used to fabricate the integrated circuits may be reduced. Unfortunately, decreasing the size of the MOSFET devices may shorten the channel length thereby possibly inducing performance problems known as "short channel effects." For example, when the channel length is reduced to about 80 nanometers (nm) or less the leakage current of the MOSFET device may be increased such that the MOSFET device may not function properly (i.e., it may be difficult to turn the MOSFET device off).

It is known to form a double gate MOSFET to reduce the short channel effects described above. In particular, a self-aligned double gate MOSFET may be formed using lateral epitaxy. One type of conventional lateral epitaxy used to form self-aligned double ate transistors is discussed in U.S. Pat. No. 5,646,058 to Taur et al. entitled *"Method or Fabricating A Self-Aligned Double-Gate MOSFET By Selective Lateral Epitaxy"* which is incorporated herein by reference. Unfortunately, tunnel epitaxy may not be well suited for some manufacturing processes.

It is also known to form self-aligned double gate MOSFETs using a transparent quartz 'handle' wafer with an ion cut technique. One such conventional technique is discussed in *"Investigation of a Novel Self-Aligned Dual Gate MOSFET Structure"* by B. E. Roberds et al., Proceedings 1998 IEEE International SOI Conference, Oct. 1998. Unfortunately, a process using quartz materials may be difficult to implement because the quartz make break easily. Moreover, short wavelength light (used, for example, to create devices having small dimensions) may be absorbed by the quartz, thereby possibly reducing the accuracy of patterning through quartz. Accordingly, there continues to exist a need to improve the fabrication of self-aligned double gate MOSFETs.

SUMMARY OF THE INVENTION

In view of the above, it is an object of the present invention to allow improvement in the fabrication of self-aligned features of integrated circuits.

It is another object of the present invention to allow improvement in the fabrication of self-aligned double gate transistors.

It is a further object of the present invention to allow improved devices having self-aligned features.

These and other objects of the present invention are provided by forming an upper gate electrode on an integrated circuit substrate and modifying a buried layer in the integrated substrate using the upper gate electrode as a mask. The modified buried layer is used to form a lower gate electrode on the integrated circuit substrate, wherein the lower gate electrode is self-aligned to the modified buried layer. Accordingly, standard fabrication techniques, such as ion implantation, etching, and wafer bonding may be used to fabricate a self-aligned double gate transistor according to the present invention. Moreover, the present invention may be utilized to form any self-aligned double sided features of integrated circuits such as contacts and vias.

In another aspect of the present invention, the lower gate electrode is self-aligned to the upper gate electrode. In one embodiment, the present invention is used to fabricate a self-aligned double gate MOSFET, wherein the self-alignment of the upper and lower gate electrodes may reduce some of the short channel effect associated with conventional approaches. The self-alignment of the upper and lower gate electrodes may also reduce a parasitic capacitance that can be caused by misalignment of upper and lower gate electrodes.

In another aspect of the present invention, electrically inactive ions are implanted to modify the buried layer. The ion implantation may modify the buried layer to form a modified buried layer at an interface of the integrated circuit substrate and the buried layer. Alternately, the modified buried layer is formed underlying the interface of the buried layer and the integrated circuit substrate.

The lower gate electrode can be formed by etching a lower surface of the integrated circuit substrate using the modified buried layer to form a cavity therein. A gate material is formed in the cavity. Alternatively, the lower gate electrode can be formed by forming a dummy gate using the modified buried layer and replacing the dummy gate with the lower gate electrode by etching out the dummy gate to form a cavity and forming the gate material in the cavity.

In an unexpected aspect of the present invention, the drain, gate, and source electrodes of a transistor formed according to the present invention can be accessed from above and/or below the transistor. For example, a plurality of first conductive lines can be formed to provide interconnect to the lower surface of the gate, drain, and source electrodes of the transistor and a plurality of second conductive lines can be formed to provide interconnect to the upper surface of the gate, drain, and source electrodes of the transistor.

Accordingly, routing of conductive lines between transistors or in/out of the integrated circuit device can be accomplished by routing the conductive lines to the upper surface or the lower surface of the drain or source electrodes. Consequently, the routing of conductive lines in the integrated circuit may be simplified due to the reduced number and/or density, of the conductive lines electrically on the respective surface. For example, the conductive lines electrically coupled to the lower surface can provide power and ground voltages to the transistors while the conductive lines electrically coupled to the upper surface can provide for the connection of signals between transistors. Reducing the density of the conductive lines may allow the width of the conductive lines to be increased, thereby reducing the resistance of the conductive lines and reducing the delay associated with the conductive lines.

In a still a further unexpected aspect of the present invention, multiple integrated circuits according to the present invention can be stacked to form multiple layers of self-aligned double gate transistors. Each of the layers of self-aligned double gate transistors has a lower level of conductive lines which can provide electrical coupling between the transistors included in the same layer (i.e., intra-layer routing) and an upper layer of conductive lines which provide electrical coupling between layers of self-aligned double transistors (i.e., inter-layer routing). Accordingly, the layers of conductive lines can be dedicated to routing particular signals in the integrated circuit device.

DETAILED DESCRIPTION OF THE INVENTION

Figure 1A:
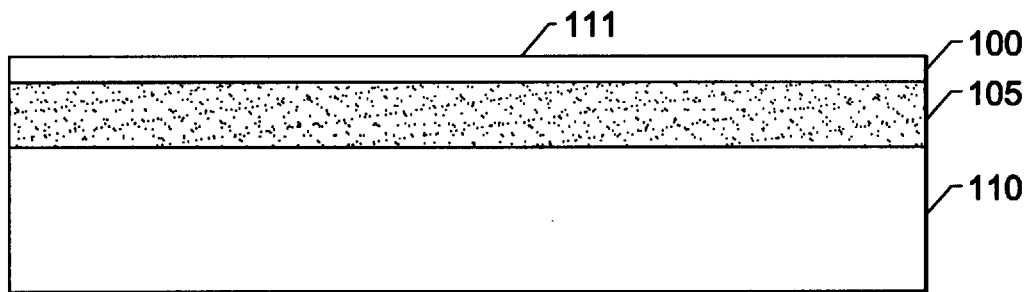
FIGS. 1A–1J are enlarged cross-sectional diagrams that illustrate the formation of self-aligned double gate transistors according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will be understood that when an element such as a layer, region or substrate is referred to as being "on" another element, it can be directly on the other element or intervening elements may also be present. Similarly, it will be understood that when an element such as a layer, region or substrate is referred to as "under" or "underlying" another element, it can be directly under the other element or intervening elements may also be present. Like numbers refer to like elements throughout.

Although the present invention is described herein with respect to a self-aligned double gate MOSFETs, the invention may be utilized to form self-aligned features in integrated circuits such as contacts or vias in the integrated circuit. As used herein, the terms "upper" and "lower" denote opposing surface and not absolute locations.

FIGS. 1A–1J are enlarged cross-sectional diagrams that illustrate the formation of self-aligned double gate MOSFETs according to the present invention. According to FIG. 1A, a device layer 100 is formed on a buried oxide layer 105 in an integrated circuit substrate 110. The integrated circuit substrate 110 includes an upper surface 111 and a lower surface 112. In a preferred embodiment, the device layer 100 comprises silicon and the buried oxide layer 105 comprises silicon dioxide as part of a Silicon On Insulator (SOI) wafer. Other forms of silicon wafers with buried layers may be used.

Figure 1B:
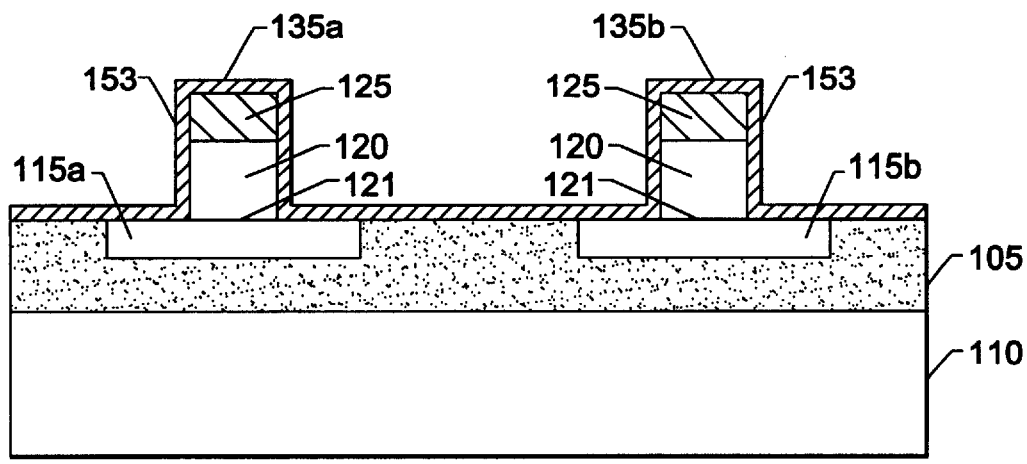

According to FIG. 1B, a plurality of device regions 115a–b are formed on the buried oxide layer 105 and isolated using techniques known to those having skill in the art, such as shallow trench isolation, LOCOS, or mesa. A plurality of upper gate electrodes 135a–b are formed on the respective device regions 115a–b. The upper gate electrode 135a can comprise a gate material layer 120 formed on a gate dielectric layer 121 using photolithographic techniques known to those having skill in the art. In a preferred embodiment, the upper gate electrode 135a includes a gate shield 125 formed the gate material layer 120. The gate shield 125 can protect the gate material layer 120 from being adversely affected during a subsequent ion implantation step.

Figure 1C:
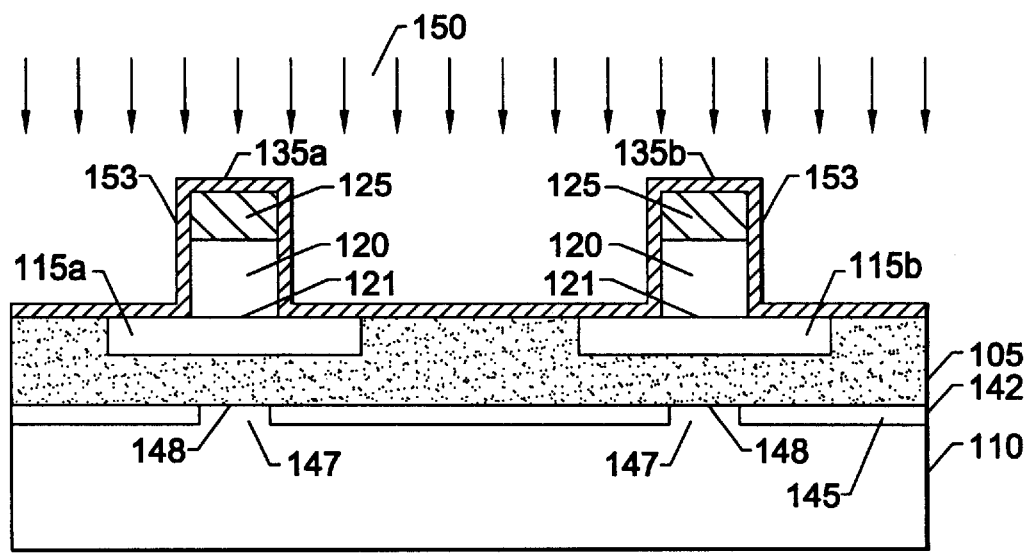

According to FIG. 1C, ions 150 are implanted using the upper gate electrodes 135a–b as a mask. The ion implantation modifies a portion of the substrate underlying the buried oxide layer, 105 to form a modified buried layer 145 having an unaffected region 147 therein that is self-aligned to the upper gate electrode 135. In other words, the upper gate electrode 135a shields the region 147 from the ion implantation which may prevent the region 147 from being modified. In a preferred embodiment, the ion implantation is performed at a dosage in a range between about $1\times10^{16}$ and $1\times10^{17}$ ions/cm$^2$. For a silicon substrate, the implanted ions can be nitrogen ions, argon ions, neon ions, or other electrically inactive ions suited for use with a silicon substrate. As will be understood by those having skill in the art, different ions can be used to form the modified buried layer 145 of the present invention.

According to the present invention, the modified buried layer 145 can comprise a portion of the integrated circuit substrate 110 that is chemically modified by the ion implantation. For example, the ion implantation may be used to damage a portion of the integrated circuit substrate, thereby causing the damaged portion to etch faster than undamaged portions of the integrated substrate 110.

As used herein, the phrase "self-aligned" includes arrangements wherein at least one of the sides of the region 147 in the modified buried layer 145 and at least one of the sides of the upper gate electrode 135 are aligned and arrangements wherein a center of the hole 148 in the modified buried layer 145 is aligned with the center of the upper gate electrode.

The ion implantation modifies the etch resistance characteristics of the silicon substrate 110 to form the modified buried layer 145. For example, the ion implantation may increase the etch resistance of the integrated circuit substrate 110 so that the modified buried layer 145 etches slower than the integrated circuit substrate 110. In one embodiment, nitrogen ions are implanted at an energy level that forms a nitrogen rich layer in the integrated circuit substrate 110 underlying an interface 142 of the integrated circuit substrate 110 and the buried oxide layer 105. In another embodiment of the present invention, the modified buried layer 145 is formed at the interface 142. In a further embodiment, a buried stack of layers is modified to form the modified buried layer 145. For example, the buried stack of layers can comprise a first layer of silicon dioxide of a thickness of about 1000 Å formed on a second layer of amorphous silicon of thickness of about 100 Å formed on a third layer of thickness of about 200 Å. In still another embodiment, the buried oxide layer 105 is not present and the ion implantation is used to modify a portion of the integrated circuit substrate 110 to form the modified buried layer 145 in the integrated circuit substrate 110.

In a subsequent step, the modified buried layer 145 is used to form a lower gate electrode 175 from the lower surface 112 of the integrated circuit substrate 110. Using the modified buried layer 145 may allow the lower gate electrode 175 to be formed self-aligned to the upper gate electrode 135. Consequently, the self-aligned double gate transistor comprising the upper gate electrode 135 and the lower gate electrode 175 may avoid some of the short channel effects and may have reduced parasitic capacitance and reduced leakage currents at short channel lengths while being suitable for manufacturing.

In a preferred embodiment, a covering layer 153 is formed on a top surface and a side wall of the upper gate electrode 135. The covering layer 153 can protect the underlying material from the ion implantation and provide an offset in the formation of the modified buried layer 145. To provide protection from the ion implantation, the covering layer 153 is formed to a thickness in a range between about 50 Å and 100 Å. To provide an offset, the covering layer 153 is formed to the thickness needed to provide the amount of the desired offset. In an alternative embodiment, a side wall spacer is formed on the side wall of the upper gate electrode 135 to provide the offset. The offset can be used to form the modified buried layer 145 with a wider hole 147 therein. The increased width of the hole 147 can be use to increase the width of the lower gate electrode 175 formed using the modified buried layer 145.

Figure 1D:
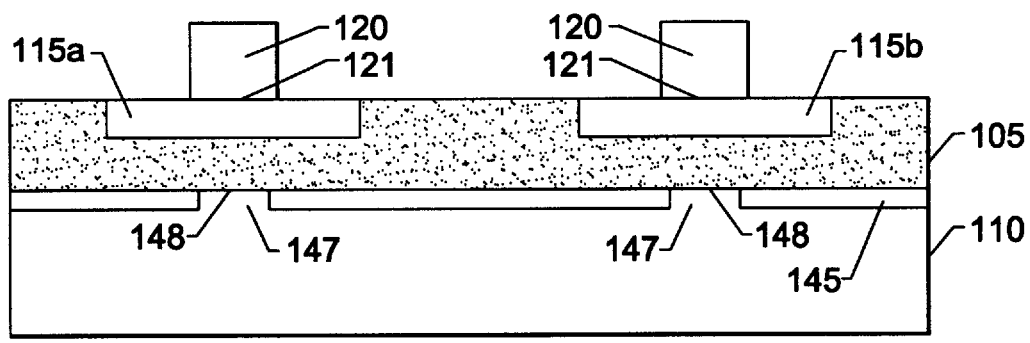
Figure 1E:
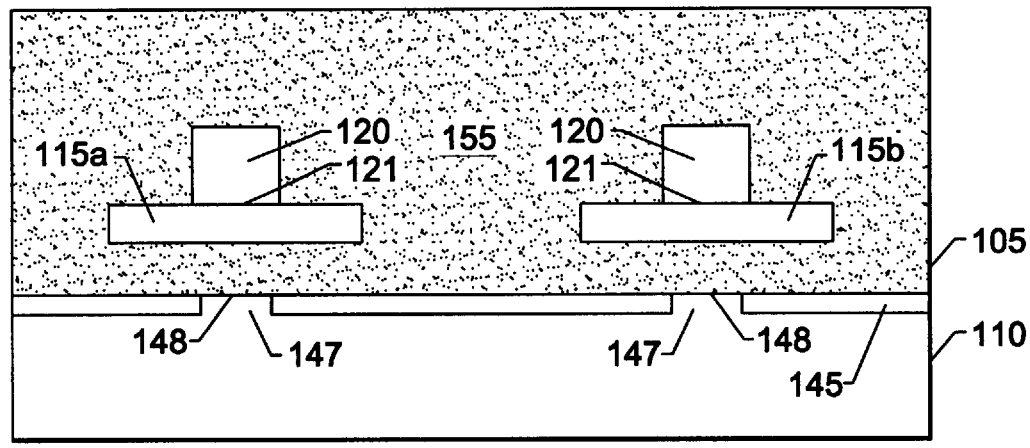

According to FIG. 1D, the offset layer 153 and the gate shield 125 are removed and the drain and source regions of the MOSFET device are formed, for example to form NMOSFET or PMOSFET devices. According to FIG. 1E, a dielectric material 155 is formed on the upper gate electrode 135 and on the upper surface 111 of the integrated circuit substrate 110. The dielectric material 155 is planarized using Chemical Mechanical Polishing (CMP) or other planarizing techniques.

In one embodiment, the completed upper gate electrodes 135a–b, and the respective drain and source regions are electrically coupled to other MOSFETs formed on the upper surface 111 of the integrated circuit 110, thereby providing the metallization for the upper surface 111. In a subsequent step, the lower gate electrode is formed on the lower surface 112 of the integrated circuit substrate 110 by processing applied to the lower surface 112. Accordingly, the metallization applied to the upper surface 111 becomes a buried interconnect layer.

Figure 1F:
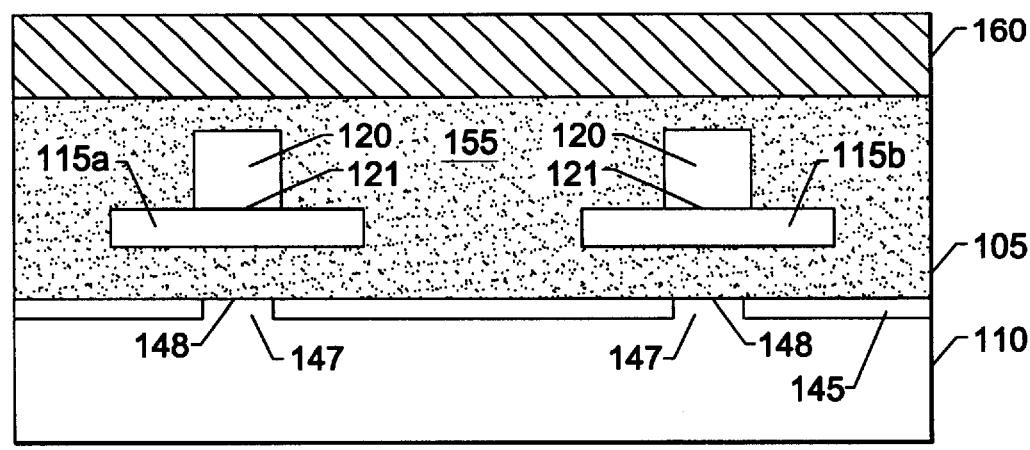
Figure 1G:
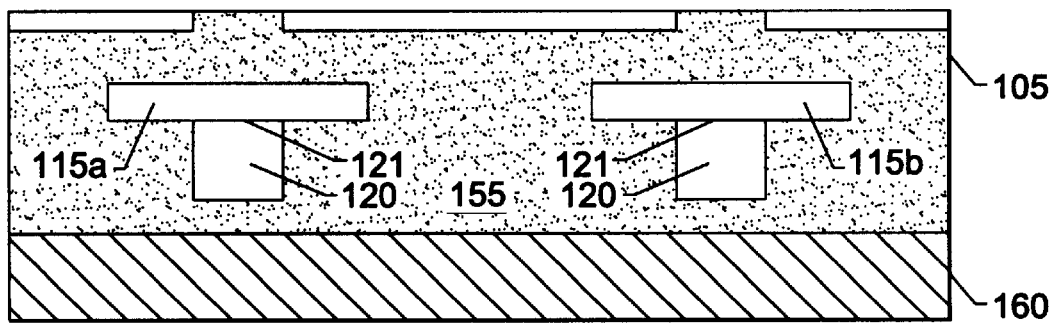

According to FIG. 1F, a handle wafer 160 is bonded to the planarized surface of the dielectric material 155 to add mechanical support to device layer 115a before a portion of the integrated circuit substrate 110 is removed. According to FIG. 1G, the integrated circuit is inverted or "flipped" so that the integrated circuit substrate 110 can be removed. The integrated circuit substrate 110 is etched from the lower surface 112 of the integrated circuit substrate 110 using the modified buried layer 145 as an etch stop layer. The lower surface of the buried oxide is also used as an etch stop in the region where there is not a modified buried layer. In particular, the integrated circuit substrate 110 is etched via a single or multi-step process in which the nitrogen-rich silicon is used as an etch stop layer in Tetramethyl Ammonium Hydroxide (TMAH). Bonding of handle wafers and flipping of integrated circuits is discussed in U.S. Pat. No. 5,497,019 to Mayer et al. entitled *"Silicon-On-Insulator Gate-All-Around MOSFET Devices And Fabrication Methods"* which is incorporated herein by reference.

Figure 1H:
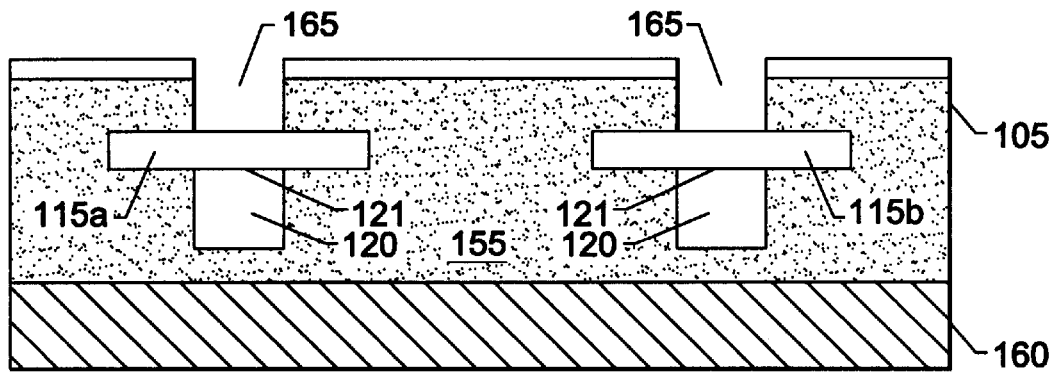
Figure 1I:
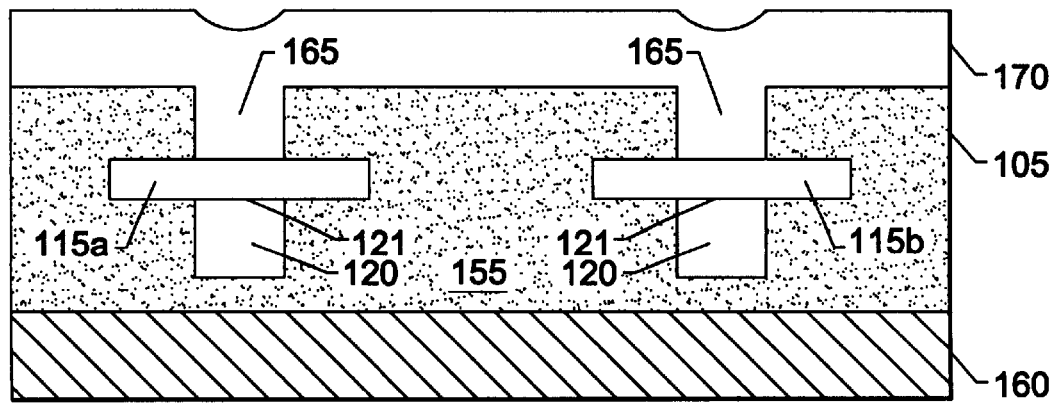
Figure 1J:
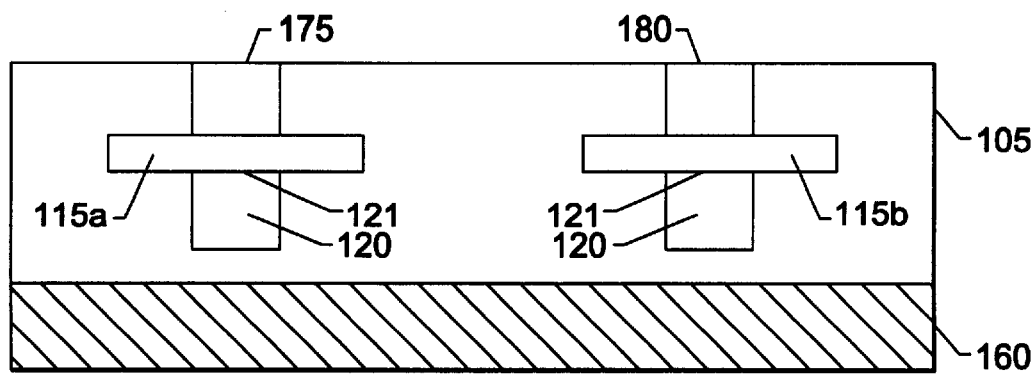

According to FIG. 1H, the buried oxide layer 105 is etched from the lower surface 112 of the integrated circuit substrate 110 using the modified buried layer 145 as a mask to form a cavity 165 that is self-aligned to the hole 147 in the modified buried layer 145. In a preferred embodiment, the cavity 165 is formed self-aligned to the upper gate electrode 135 so that the lower gate electrode 175 can be formed self-aligned to the upper gate electrode 135. As shown in FIG. 1I, a gate material 170 is formed in the self-aligned cavity 165. According to FIG. 1J, the excess gate material 170 is removed to electrically isolate the lower gate electrodes 175, 180 thereby forming the self-aligned double gate MOSFET wherein the lower gate electrode 175 is self-aligned to the upper gate electrode 135. For example the excess gate material 170 can be removed using CMP, photolithography (to produce a T-gate structure for the lower gate electrode 175) or other technique known to those having skill in the art. Processing of the integrated circuit can proceed using a CMOS backend process, for example, to electrically interconnect selected MOSFETs via the respective drain, gate, and source electrodes.

Figure 2A:
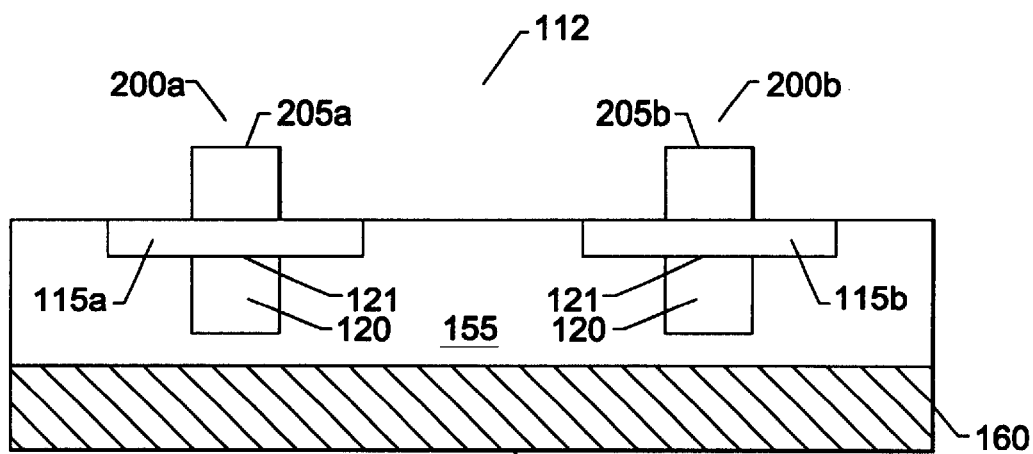
FIGS. 2A–2B are enlarged cross-sectional diagrams that illustrate the formation of a lower gate of a self-aligned double gate MOSFET using a replacement gate technique.
Figure 2B:
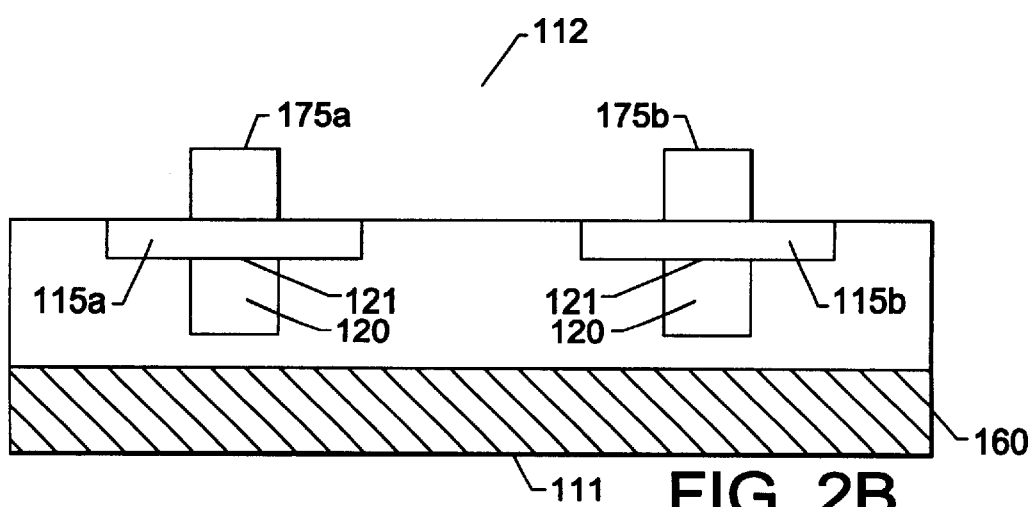

In an alternate embodiment shown in FIGS. 2A–2B, the lower gate electrodes 175a–b are formed by forming dummy gate electrodes 200a–b self-aligned to the hole 147 in the modified buried layer 145 and replacing the dummy gate electrodes 200a–b with the respective lower gate electrodes 175a–b. The dummy gate electrode 200a is formed by an ion implantation that modifies the buried oxide layer 105, or the integrated circuit substrate 110 just underlying the buried oxide layer 105, so that the modified buried layer 145 etches faster than the integrated circuit substrate 110.

According to FIG. 2A, the integrated circuit substrate 110 is etched from the lower surface 112 of the integrated circuit substrate 110 to form a protrusion 205a from the integrated circuit self-aligned to the upper gate electrode 135. Dummy gate electrodes may be used in situations where the gate materials may not withstand the temperatures used to process the integrated circuit during the front-end process. According to FIG. 2B, the protrusion 205a is replaced with the lower gate electrode 175a after the front end processing is complete using a replacement gate technique known to those having skill in the art.

Figure 3:
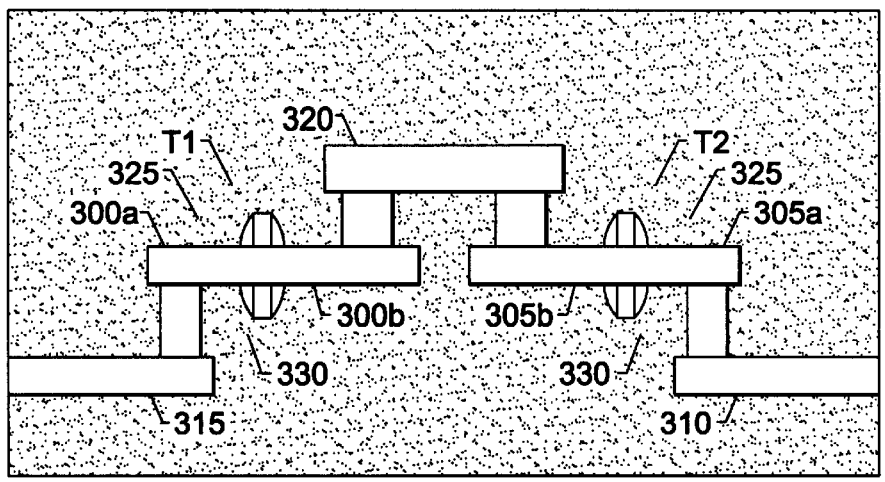
FIG. 3 is an enlarged cross-sectional diagram of MOSFET devices formed according to the present invention.

FIG. 3 is an enlarged cross-sectional diagram of MOSFET devices formed according to the present invention as shown in FIGS. 1A–1J. As shown in FIG. 3, a first MOSFET T1 includes a first drain electrode 300a and a first source electrode 300b and a second MOSFET T2 includes a second drain electrode 305a and a second source electrode 305b. Each of the source and drain electrodes has an upper surface 325 and a lower surface 330 that corresponds to the upper surface 111 and lower surface 112 respectively.

According to FIG. 3, conductive lines can be electrically coupled to the drain and source electrodes of the first and second MOSFETs T1, T2 at the upper surface 325 or at the lower surface 330. As shown in FIG. 3, a first conductive line 315 is electrically coupled to the lower surface 330 of the first drain electrode 300a and a second conductive line 320 is electrically coupled to the upper surface 325 of the first source electrode 300b and electrically coupled to the upper surface 325 of the second source electrode 305b. A third conductive line 310 is electrically coupled to the lower surface 330 of the second drain electrode 305a. In one embodiment, the conductive lines 315, 310 electrically coupled to the first and second drain electrodes 315, 310 of the MOSFETs T1, T2 at the lower surface 330 comprise a buried interconnect layer in the MOSFET device. Consequently, the power and ground voltages for the MOSFET device are distributed on the buried interconnect layer relatively close to the first and second MOSFET devices T1, T2. It will be understood that dielectric layers that support and insulate the conductive lines are not shown.

Accordingly, routing of conductive lines between MOSFETs or in/out of the MOSFET device can be accomplished by routing the conductive lines to the upper surface 325 or the lower surface 330. Consequently, the routing of conductive lines in an integrated circuit according to the present invention may be simplified due to the reduced number, and/or density, of the conductive lines electrically coupled to the MOSFET devices on the respective surface. For example, conductive lines electrically coupled to the lower surface 330 can provide power and ground voltages to the first and second MOSFETs T1, T2 while the conductive lines electrically coupled to the upper surface 325 can provide for the interconnection of signals between MOSFET devices T1,T2. Reducing the density of the conductive lines may allow the width of the conductive lines to be increased, thereby reducing the resistance of the conductive lines and reducing the RC delay associated with the conductive lines.

Figure 4:
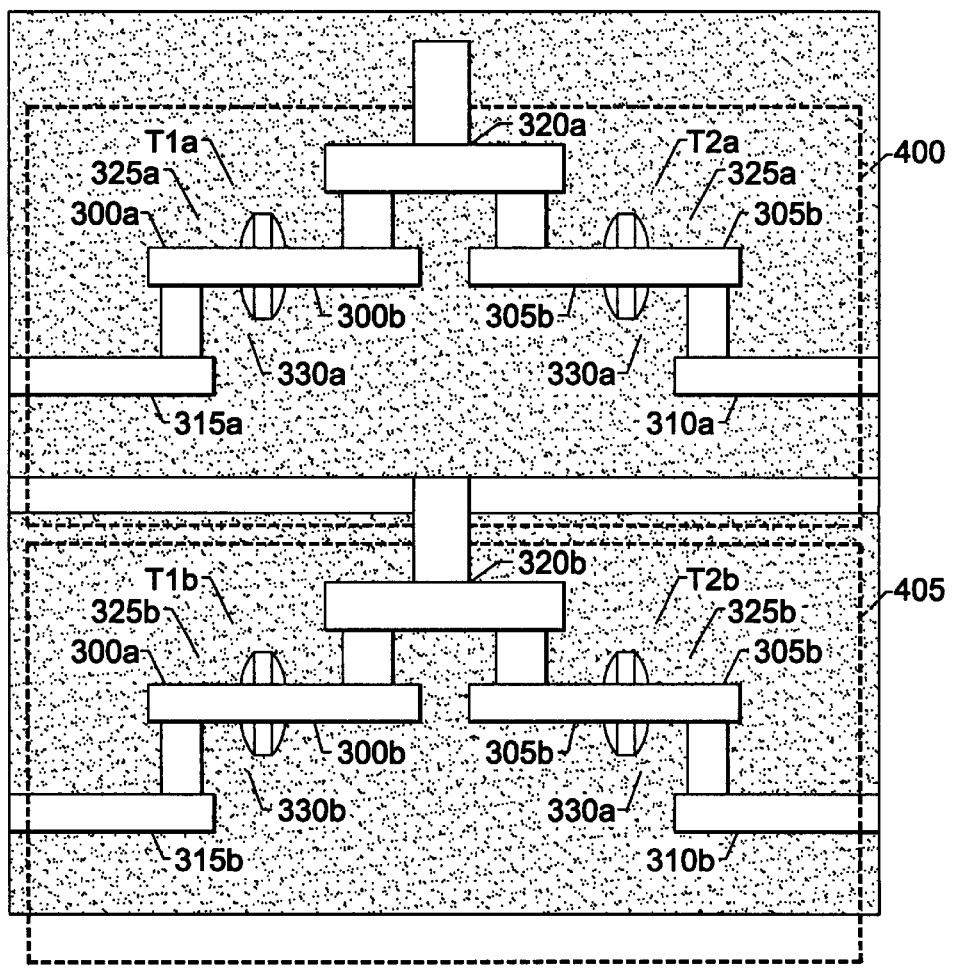
FIG. 4 is an enlarged cross-sectional diagram of coupled inter-level integrated circuits and coupled intra-level integrated circuits according to the present invention.

FIG. 4 is an enlarged cross-sectional diagram of stacked self-aligned double gate MOSFETs according to the present invention. According to FIG. 4, multiple layers of the MOSFETs T1, T2 shown in FIG. 3 are stacked in the MOSFET device. In particular, the MOSFET device includes an upper layer 400 of self-aligned double gate MOSFETs T1a, T2a and a lower layer 405 of self-aligned double gate MOSFETs T1b, T2b. Each of the layers 400, 405 of self-aligned double gate MOSFETs has a lower level of conductive lines which provide electrical coupling between the MOSFETs included in the same layer and an upper layer of conductive lines which provide electrical coupling between layers of self-aligned double gate MOSFETs.

According to the present invention, the layers of conductive lines can be dedicated to routing signals in the MOSFET device. For example, the upper level conductive lines can be used to route signals between the upper and lower layers of self-aligned double gate MOSFETs (i.e., inter-layer routing) while the lower level conductive lines are used to route signals between MOSFETs within the same layer (i e., intra-layer routing). For example, a conductive line 320b provides electrical coupling between the upper layer 400 and the lower layer 405. First and second conductive lines 315b, 310b provide coupling between MOSFETs including the lower layer 405 and first and second conductive lines 315a, 310a provide electrical coupling between MOSFETs included in the upper layer 400.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming an integrated circuit double gate transistor, the method comprising the steps of:
    forming a first gate electrode of the double gate transistor on an integrated circuit substrate;
    modifying a buried layer in the integrated circuit substrate using the first gate electrode of the double gate transistor as a mask; and then
    forming a second gate electrode of the double gate transistor that is self-aligned to the modified buried layer.

2. The method of claim 1, wherein the step of forming a second gate electrode comprises the step of forming the second gate electrode of the double gate transistor, self-aligned to the first gate electrode of the double gate transistor.

3. The method of claim 1, wherein the step of modifying a buried layer comprises the step of modifying a portion of the integrated circuit substrate.

4. The method of claim 1, wherein the step of modifying a buried layer comprises the step of forming a modified buried layer in the integrated circuit substrate.

5. The method of claim 4, wherein the step of forming comprises the step of forming the modified buried layer at an interface of the buried layer and the integrated circuit substrate.

6. The method of claim 4, wherein the step of modifying comprises the step of implanting electrically inactive ions into the buried layer.

7. The method of claim 6, wherein the step of implanting comprises the step of implanting electrically inactive ions selected from a group consisting of nitrogen, argon, and neon.

8. The method of claim 4, wherein the step of modifying comprises the step of modifying a buried oxide layer in the integrated circuit substrate.

9. The method of claim 1, wherein the step of forming a second gate electrode comprises the steps of:
    etching the integrated circuit substrate using the modified buried layer as a mask to form a cavity therein, wherein the cavity is self-aligned to the first gate electrode of the double gate transistor; and
    forming the second gate electrode in the self-aligned cavity in the integrated circuit substrate.

10. The method of claim 1, wherein the step of forming a second gate electrode comprises the steps of:
    removing a portion of the integrated circuit substrate to form a protrusion from the integrated circuit substrate, self-aligned to the first gate electrode; and
    replacing the protrusion from the integrated circuit substrate with the second gate electrode of the double gate transistor.

11. The method of claim 1, wherein the step of forming a first gate electrode comprises the steps of:
    forming the first gate electrode of the double gate transistor on the integrated circuit substrate; and
    forming a protective layer on the first gate electrode, wherein the protective layer protects the first gate electrode during the formation of the modified buried layer in the integrated circuit substrate.

12. The method of claim 1, wherein the step of forming a first gate electrode comprises the steps of:
    forming the first gate electrode of the double gate transistor on the integrated circuit substrate; and
    forming a spacer on a side wall of the first gate electrode.

13. The method of claim 12, wherein the step of modifying a buried layer comprises the step of modifying the buried layer using the first gate electrode and the spacer on a side wall of the first gate electrode as a mask.

14. The method of claim 1, wherein the step of forming a first gate electrode comprises the steps of:
    forming the first gate electrode of the double gate transistor on the integrated circuit substrate; and
    forming a protective layer on a side wall of the first gate electrode of a thickness in a range between about 50 and 100 Å.

15. The method of claim 1, wherein the step of forming a first gate electrode comprises the steps of:
    forming the first gate electrode of the double gate transistor on the integrated circuit substrate; and
    forming an offset layer on a side wall of the first gate electrode.

16. A method of forming a device, the method comprising the steps of:
   forming a first device feature of the device on a substrate;
   modifying a buried layer in the substrate using the first device feature as a mask; and then
   forming a second device feature of the device that is self-aligned to the modified buried layer.

17. The method of claim 16, wherein the step of forming a second device feature comprises the step of forming the second device feature, self-aligned to the first device feature.

18. The method of claim 16, wherein the step of modifying a buried layer comprises the step of modifying a portion of the substrate.

19. The method of claim 16, wherein the step of modifying a buried layer comprises the step of modifying a buried layer to form a modified buried layer.

20. The method of claim 19, wherein the step of modifying comprises the step of modifying the buried layer to form the modified buried layer at an interface of the buried layer and the substrate.

21. The method of claim 19, wherein the step of modifying comprises the step of implanting electrically inactive ions in the buried layer.

22. The method of claim 21, wherein the step of implanting comprises the step of implanting electrically inactive ions selected from a group consisting of nitrogen, argon, and neon.

23. The method of claim 21, wherein the step of modifying comprises the step of modifying a buried oxide layer in the substrate.

24. The method of claim 16, wherein the step of forming a second device feature comprises the steps of:
   etching the substrate using the modified buried layer as a mask to form a cavity therein, wherein the cavity is self-aligned to the first device feature; and
   forming the second device feature in the self-aligned cavity in the substrate.

25. The method of claim 16, wherein the step of forming a second device feature comprises the steps of:
   removing a portion of the substrate to form a protrusion from the substrate, self-aligned to the first device feature; and
   replacing the protrusion from the substrate with the second device feature.

26. The method of claim 16, wherein the step of forming a first device feature comprises the steps of:
   forming the first device feature on the substrate; and
   forming a protective layer on the first device feature, wherein the protective layer protects the first device feature during the formation of the modified buried layer in the substrate.

27. The method of claim 16, wherein the step of forming a first device feature comprises the steps of:
   forming the first device feature on the substrate; and
   forming a spacer on a side wall of the first device feature.

28. The method of claim 16, wherein the step of forming a first device feature comprises the steps of:
   forming the first device feature on the substrate; and
   forming a protective layer on a side wall of the first device feature of a thickness in a range between about 50 and 100 Å.

29. The method of claim 16, wherein the step of forming a first device feature comprises the steps of:
   forming the first device feature on the substrate; and
   forming an offset layer on a side wall of the first device feature.

30. A method of forming an integrated circuit double gate transistor, the method comprising the steps of:
   forming an upper gate electrode of the double gate transistor on an integrated circuit substrate;
   modifying a buried layer in the integrated circuit substrate using the upper gate electrode of the double gate transistor as a mask; and then
   forming a lower gate electrode of the double gate transistor that is self-aligned to the modified buried layer.

31. The method of claim 30, wherein the step of forming a lower gate electrode comprises the steps of:
   etching the integrated circuit substrate using the modified buried layer as a mask to form a cavity therein, wherein the cavity is self-aligned to the upper gate electrode of the double gate transistor; and
   forming the lower gate electrode in the self-aligned cavity in the integrated circuit substrate.

* * * * *